(12) United States Patent
Hui et al.

(10) Patent No.: US 10,498,490 B2
(45) Date of Patent: Dec. 3, 2019

(54) CODING AND DECODING OF A POLAR CODE CONCATENATED WITH INTERLEAVING WITH AN OUTER SYSTEMATIC CODE

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/261,731

(22) Filed: Jan. 30, 2019

(65) Prior Publication Data

US 2019/0158226 A1 May 23, 2019

Related U.S. Application Data

(63) Continuation of application No. PCT/IB2017/058082, filed on Dec. 18, 2017.

(Continued)

(51) Int. Cl.
*H04L 1/00* (2006.01)
*H03M 13/13* (2006.01)
*H03M 13/29* (2006.01)

(52) U.S. Cl.
CPC .......... *H04L 1/0071* (2013.01); *H03M 13/13* (2013.01); *H03M 13/2906* (2013.01);
(Continued)

(58) Field of Classification Search
CPC ... H04L 1/0071; H04L 1/0041; H04L 1/0061; H04L 1/0057
See application file for complete search history.

(56) References Cited

U.S. PATENT DOCUMENTS

2016/0079999 A1   3/2016 Shen et al.
2018/0248567 A1*  8/2018 Qu .................. H03M 13/13

FOREIGN PATENT DOCUMENTS

CN   106209113 A    12/2016
WO   2018130892 A1   7/2018

OTHER PUBLICATIONS

Zhou et al. "Segmented CRC—Aided SC List Polar Decoding", Mar. 16, 2016, IEEE.*

(Continued)

*Primary Examiner* — Jae Y Lee
(74) *Attorney, Agent, or Firm* — Withrow & Terranova, PLLC

(57) ABSTRACT

Systems and methods related to concatenated polar encoding with interleaving are disclosed. In some embodiments, a method of operation of a radio node to perform encoding of a plurality of data bits for transmission by the radio node comprises encoding a plurality of data bits using a linear encoder to provide a first plurality of coded bits, where the first plurality of coded bits comprises a plurality of parity bits and the plurality of data bits. The method further comprises interleaving the first plurality of coded bits in accordance with an interleaving mapping to provide a plurality of interleaved bits and encoding the plurality of interleaved bits using a polar encoder to provide a second plurality of coded bits to be transmitted by the radio node.

24 Claims, 10 Drawing Sheets

Related U.S. Application Data

(60) Provisional application No. 62/444,560, filed on Jan. 10, 2017.

(52) U.S. Cl.
CPC .......... *H04L 1/0041* (2013.01); *H04L 1/0057* (2013.01); *H04L 1/0061* (2013.01)

(56) References Cited

OTHER PUBLICATIONS

Arikan, Erdal, "Channel Polarization: A Method for Constructing Capacity—Achieving Codes for Symmetric Binary—Input Memoryless Channels," IEEE Transactions on Information Theory, vol. 55, No. 7, Jul. 2009, pp. 3051-3073.

Guo, Jianfeng, et al., "Multi-CRC Polar Codes and Their Applications," IEEE Communications Letters, vol. 20, No. 2, IEEE, Feb. 2016, pp. 212-215.

Tal, Ido, et al., "List Decoding of Polar Codes," IEEE Transactions on Information Theory, vol. 61, No. 5, May 2015, 11 pages.

Wang, Tao, et al., "Parity-Check—Concatenated Polar Codes," IEEE Communications Letters, vol. 20, No. 12, IEEE, Dec. 2016, pp. 2342-2345.

Yu, Qingping, et al., "Hybrid Partity-check and CRC Aided SCL Decoding for Polar codes," IEEE International Conference on Internet of Things (iThings) and IEEE Green Computing and Communications (GreenCom) and IEEE Cyber, Physical and Social Computing (CPSCom) and IEEE Smart Data (SmartData), IEEE, 2016, pp. 711-716.

Zhou, Huayi, et al., "Segmented CRC—Aided SC List Polar Decoding," IEEE 83rd Vehicular Technology Conference (VTC Spring), Nanjing, IEEE, 2016, 5 pages.

International Search Report and Written Opinion for International Patent Application No. PCT/IB2017/058082, dated Mar. 26, 2018, 14 pages.

Nokia et al., "R1-1701033: Polar codes design for UL control," 3GPP TSG-RAN WG1#NR Ad-Hoc meeting, Jan. 16-20, 2017, Spokane, US, 5 pages.

International Preliminary Report on Patentability for International Patent Application No. PCT/IB2017/058082, dated Apr. 9, 2019, 26 pages.

\* cited by examiner

CODING AND DECODING OF A POLAR CODE CONCATENATED WITH INTERLEAVING WITH AN OUTER SYSTEMATIC CODE

RELATED APPLICATIONS

The present application is a continuation of International Application No. PCT/IB2017/058082, filed Dec. 18, 2017, which claims priority to Provisional Application No. 62/444,560 filed Jan. 10, 2017, the disclosures of which are incorporated herein by reference in their entireties.

TECHNICAL FIELD

Embodiments of the present disclosure relate to the field of wireless communication, and more specifically to methods, an apparatus, and systems for implementing concatenated polar code with interleaving.

BACKGROUND

Polar codes, proposed by Arikan [1], are the first class of constructive coding schemes that are provable to achieve the symmetric capacity of the binary-input discrete memoryless channels under a low-complexity Successive Cancellation (SC) decoder. However, the finite-length performance of polar codes under SC is not competitive compared to other modern channel coding schemes such as Low-Density Parity-Check (LDPC) codes and turbo codes. Later, a SC List (SCL) decoder is proposed in [2], which can approach the performance of optimal Maximum-Likelihood (ML) decoder. By concatenating a simple Cyclic Redundancy Check (CRC) coding, it was shown that the performance of concatenated polar code is competitive with that of well-optimized LDPC and turbo codes. As a result, polar codes are being considered as a candidate for future Fifth Generation (5G) wireless communication systems.

The main idea of polar coding is to transform a pair of identical binary-input channels into two distinct channels of different qualities, one better and one worse than the original binary-input channel. By repeating such a pair-wise polarizing operation on a set of $2^M$ independent uses of a binary-input channel, a set of $2^M$ "bit-channels" of varying qualities can be obtained. Some of these bit channels are nearly perfect (i.e., error free) while the rest of the bit channels are nearly useless (i.e., totally noisy). The point is to use the nearly perfect channel to transmit data to the receiver while setting the input to the useless channels to have fixed or frozen values (e.g., 0) known to the receiver. For this reason, those input bits to the nearly useless and the nearly perfect channel are commonly referred to as frozen bits and non-frozen (or information) bits, respectively. Only the non-frozen bits are used to carry data in a polar code. An illustration of the structure of a length-8 polar code is illustrated in FIG. 1.

Although the original polar code, as proposed by Arikan [1], was proven to be capacity achieving with a low-complexity SC decoder, the finite-length performance of polar codes under SC is not competitive compared to other modern channel coding schemes such LDPC and turbo codes. A more complex decoder, namely the SCL decoder, is proposed in [2], where a list of more than one surviving decision path is maintained in the decoding process, but the resulting performance is still unsatisfactory. In [2], it was further proposed that by concatenating a linear outer code, namely a CRC code, with the original polar code as inner code, the outer code can be used to check if any of the candidate paths in the list are correctly decoded. Such a two-step decoding process significantly improves the performance and makes polar codes competitive with that of well-optimized LDPC and Turbo codes. However, such a two-step decoding process is in general sub-optimal as each step does not take into the account of the structure of the other (inner or outer) code.

SUMMARY

Systems and methods related to concatenated polar encoding with interleaving are disclosed. In some embodiments, a method of operation of a radio node to perform encoding of a plurality of data bits for transmission by the radio node comprises encoding a plurality of data bits using a linear encoder to provide a first plurality of coded bits, where the first plurality of coded bits comprises a plurality of parity bits and the plurality of data bits. The method further comprises interleaving the first plurality of coded bits in accordance with an interleaving mapping to provide a plurality of interleaved bits and encoding the plurality of interleaved bits using a polar encoder to provide a second plurality of coded bits to be transmitted by the radio node. In some embodiments, this concatenated polar encoding with interleaving of the data and parity bits enables single-step decoding at the receiver. In some embodiments, the interleaving of the data and parity bits enables the bit-wise checking of the parity bits earlier in the decoding process, which in turn reduces the latency of the decoding process.

In some embodiments, the interleaving mapping maps the plurality of interleaved bits to inputs of the polar encoder.

In some embodiments, the plurality of interleaved bits is a sequence of bits comprising the plurality of parity bits interleaved with the plurality of data bits, and the interleaving mapping is such that at least one of the plurality of parity bits precedes at least one of the plurality of data bits in the sequence of bits.

In some embodiments, the plurality of interleaved bits is a sequence of bits comprising the plurality of parity bits interleaved with the plurality of data bits and each parity bit of the plurality of parity bits is a function of a respective subset of the plurality of data bits. Further, the interleaving mapping is such that at least one of the plurality of parity bits is at a position in the sequence of bits that is: (a) after all of the subset of the plurality of data bits of which the at least one of the plurality of parity bits is a function and (b) before a last of the plurality of data bits within the sequence of bits.

In some embodiments, the plurality of interleaved bits is a sequence of bits comprising the plurality of parity bits interleaved with the plurality of data bits and each parity bit of the plurality of parity bits is a function of a respective subset of the plurality of data bits. Further, the interleaving mapping is such that at least one of the plurality of parity bits is at a position in the sequence of bits that is: (a) immediately after a last of the subset of the plurality of data bits of which the at least one of the plurality of parity bits is a function within the sequence of bits and (b) before a last of the plurality of data bits within the sequence of bits.

In some embodiments, encoding the plurality of data bits using the linear encoder comprises encoding the plurality of data bits in accordance with a generator matrix $G_{outer} = [I|P_{outer}]$, where I is an identity matrix of size K×K where K is the number of data bits in the plurality of data bits and $P_{outer}$ is a parity matrix that defines each of the plurality of parity bits as a function of a respective subset of the plurality of data bits. Further, the interleaving mapping is defined as $\phi = b \circ \phi_c$, where b is a bit mapping that maps the plurality of interleaved bits to a plurality of non-frozen inputs of the polar encoder and $\phi_c$ is a column permutation mapping of a column permutation matrix $\Phi_c$ that, together with a row permutation matrix $\Phi_r$, provide $G'_{outer} \triangleq \Phi_r G_{outer} \Phi_c^T$, where $G'_{outer}$ is an upper block-triangular matrix with exactly K being those of the identity matrix I.

In some embodiments, the linear encoder is a Cyclic Redundancy Check (CRC) encoder.

Embodiments of a radio node for performing encoding of a plurality of data bits for transmission by the radio node are also disclosed. In some embodiments, a radio node for performing encoding of a plurality of data bits for transmission by the radio node is adapted to encode a plurality of data bits using a linear encoder to provide a first plurality of coded bits, where the first plurality of coded bits comprises a plurality of parity bits and the plurality of data bits. The radio node is further adapted to interleave the first plurality of coded bits in accordance with an interleaving mapping to provide a plurality of interleaved bits and encode the plurality of interleaved bits and one or more frozen bits using a polar encoder to provide a second plurality of coded bits to be transmitted by the radio node.

In some embodiments, a radio node for performing encoding of a plurality of data bits for transmission by the radio node comprises a transmitter and at least one processor operable to encode a plurality of data bits using a linear encoder to provide a first plurality of coded bits, where the first plurality of coded bits comprises a plurality of parity bits and the plurality of data bits. The at least one process is further operable to interleave the first plurality of coded bits in accordance with an interleaving mapping to provide a plurality of interleaved bits and encode the plurality of interleaved bits and one or more frozen bits using a polar encoder to provide a second plurality of coded bits to be transmitted by the radio node.

In some embodiments, the interleaving mapping maps the plurality of interleaved bits to inputs of the polar encoder.

In some embodiments, the plurality of interleaved bits is a sequence of bits comprising the plurality of parity bits interleaved with the plurality of data bits, and the interleaving mapping is such that at least one of the plurality of parity bits precedes at least one of the plurality of data bits in the sequence of bits.

In some embodiments, the plurality of interleaved bits is a sequence of bits comprising the plurality of parity bits interleaved with the plurality of data bits and each parity bit of the plurality of parity bits is a function of a respective subset of the plurality of data bits. Further, the interleaving mapping is such that at least one of the plurality of parity bits is at a position in the sequence of bits that is: (a) after all of the subset of the plurality of data bits of which the at least one of the plurality of parity bits is a function and (b) before a last of the plurality of data bits within the sequence of bits.

In some embodiments, the plurality of interleaved bits is a sequence of bits comprising the plurality of parity bits interleaved with the plurality of data bits, and each parity bit of the plurality of parity bits is a function of a respective subset of the plurality of data bits. Further, the interleaving mapping is such that at least one of the plurality of parity bits is at a position in the sequence of bits that is: (a) immediately after a last of the subset of the plurality of data bits of which the at least one of the plurality of parity bits is a function within the sequence of bits and (b) before a last of the plurality of data bits within the sequence of bits.

In some embodiments, in order to encode the plurality of data bits using the linear encoder, the radio node is further operable to encode the plurality of data bits in accordance with a generator matrix $G_{outer} = [I | P_{outer}]$, where I is an identity matrix of size K×K where K is the number of data bits in the plurality of data bits and $P_{outer}$ is a parity matrix that defines each of the plurality of parity bits as a function of a respective subset of the plurality of data bits. Further, the interleaving mapping is defined as $\phi = b \circ \phi_c$, where b is a bit mapping that maps the plurality of interleaved bits to a plurality of non-frozen inputs of the polar encoder, and $\phi_c$ is a column permutation mapping of a column permutation matrix $\Phi_c$ that, together with a row permutation matrix $\Phi_r$, provide $G'_{outer} \triangleq \Phi_r G_{outer} \Phi_c^T$, where $G'_{outer}$ is an upper block-triangular matrix with exactly K being those of the identity matrix I.

In some embodiments, the linear encoder is a CRC encoder.

Embodiments of a method of operation of a radio node to perform decoding of a plurality of coded bits received by the radio node are also disclosed. In some embodiments, a method of operation of a radio node to perform decoding of a plurality of coded bits received by the radio node comprises decoding a plurality of coded data bits using a polar decoder to provide a plurality of decoded bits, where the plurality of decoded bits comprises a plurality of parity bits interleaved with a plurality of data bits. The method further comprises deinterleaving the plurality of decoded bits in accordance with an interleaving mapping to thereby provide the plurality of parity bits and the plurality of data bits.

In some embodiments, decoding the plurality of coded bits comprises decoding a plurality of input Log-Likelihood Ratios (LLRs) of the plurality of coded bits using a modified Successive Cancellation List (SCL) polar decoder, wherein the plurality of coded bits is a plurality of polar encoded bits that result from a polar encoding of the plurality of interleaved bits comprising the plurality of data bits and the plurality of parity bits that are interleaved with the plurality of data bits in accordance with the interleaving mapping and the modified SCL polar decoder is a SCL polar decoder that takes into account the interleaving mapping.

In some embodiments, the plurality of interleaved bits is a sequence of bits comprising the plurality of parity bits interleaved with the plurality of data bits, and the interleaving mapping is such that at least one of the plurality of parity bits precedes at least one of the plurality of data bits in the sequence of bits.

In some embodiments, the plurality of interleaved bits is a sequence of bits comprising the plurality of parity bits interleaved with the plurality of data bits and each parity bit of the plurality of parity bits is a function of a respective subset of the plurality of data bits. Further, the interleaving mapping is such that at least one of the plurality of parity bits is at a position in the sequence of bits that is: (a) after all of the subset of the plurality of data bits of which the at least one of the plurality of parity bits is a function and (b) before a last of the plurality of data bits within the sequence of bits.

In some embodiments, the plurality of interleaved bits is a sequence of bits comprising the plurality of parity bits interleaved with the plurality of data bits and each parity bit of the plurality of parity bits is a function of a respective subset of the plurality of data bits. Further, the interleaving mapping is such that at least one of the plurality of parity bits is at a position in the sequence of bits that is: (a) immediately after a last of the subset of the plurality of data bits of which the at least one of the plurality of parity bits is a function within the sequence of bits and (b) before a last of the plurality of data bits within the sequence of bits.

In some embodiments, the plurality of data bits and the plurality of parity bits are a result of CRC encoding of the plurality of data bits.

Embodiments of a radio node to perform decoding of a plurality of coded bits received by the radio node are also disclosed. In some embodiments, a radio node to perform decoding of a plurality of coded bits received by the radio node is adapted to decode a plurality of coded data bits using a polar decoder to provide a plurality of decoded bits, where the plurality of decoded bits comprising a plurality of parity bits interleaved with a plurality of data bits. The radio node is further adapted to deinterleave the plurality of decoded bits in accordance with an interleaving mapping to thereby provide the plurality of parity bits and the plurality of data bits.

In some embodiments, a radio node to perform decoding of a plurality of coded bits received by the radio node comprises a transmitter and at least one processor operable to decode a plurality of coded data bits using a polar decoder to provide a plurality of decoded bits, where the plurality of decoded bits comprises a plurality of parity bits interleaved with a plurality of data bits, and deinterleave the plurality of decoded bits in accordance with an interleaving mapping to thereby provide the plurality of parity bits and the plurality of data bits.

In some embodiments, in order to decode the plurality of coded bits, the at least one processor is further operable to decode a plurality of input LLRs of the plurality of coded bits using a modified SCL polar decoder, wherein the plurality of coded bits is a plurality of polar encoded bits that result from a polar encoding of the plurality of interleaved bits comprising the plurality of data bits and the plurality of parity bits that are interleaved with the plurality of data bits in accordance with the interleaving mapping and the modified SCL polar decoder is a SCL polar decoder that takes into account the interleaving mapping.

In some embodiments, the plurality of interleaved bits is a sequence of bits comprising the plurality of parity bits interleaved with the plurality of data bits, and the interleaving mapping is such that at least one of the plurality of parity bits precedes at least one of the plurality of data bits in the sequence of bits.

In some embodiments, the plurality of interleaved bits is a sequence of bits comprising the plurality of parity bits interleaved with the plurality of data bits and each parity bit of the plurality of parity bits is a function of a respective subset of the plurality of data bits. Further, the interleaving mapping is such that at least one of the plurality of parity bits is at a position in the sequence of bits that is: (a) after all of the subset of the plurality of data bits of which the at least one of the plurality of parity bits is a function and (b) before a last of the plurality of data bits within the sequence of bits.

In some embodiments, the plurality of interleaved bits is a sequence of bits comprising the plurality of parity bits interleaved with the plurality of data bits and each parity bit of the plurality of parity bits is a function of a respective subset of the plurality of data bits. Further, the interleaving mapping is such that at least one of the plurality of parity bits is at a position in the sequence of bits that is: (a) immediately after a last of the subset of the plurality of data bits of which the at least one of the plurality of parity bits is a function within the sequence of bits and (b) before a last of the plurality of data bits within the sequence of bits.

In some embodiments, the plurality of data bits and the plurality of parity bits are a result of CRC encoding of the plurality of data bits.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
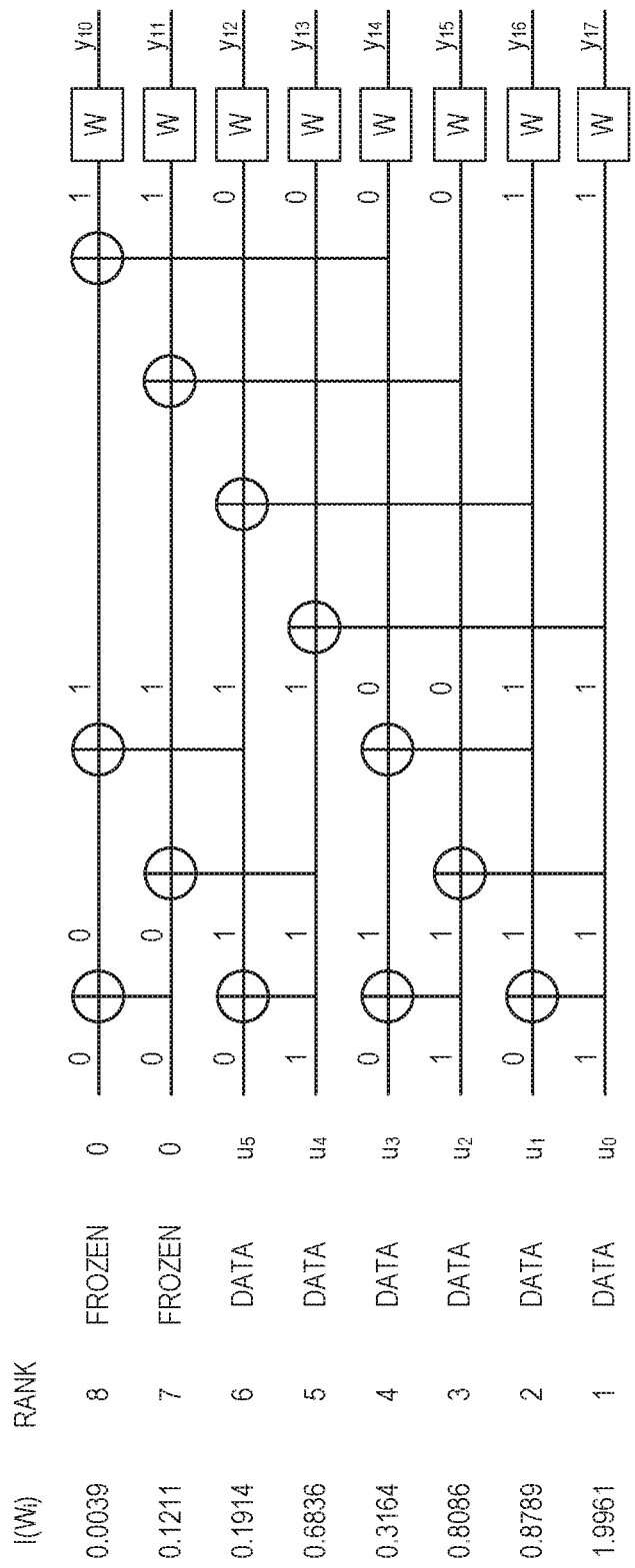
FIG. 1 is an example of a polar code structure with N=8, according to various embodiments of the present disclosure.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

In the following description, numerous specific details are set forth. However, it is understood that embodiments of the present disclosure may be practiced without these specific details. In other instances, well-known circuits, structures, and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless device.

Radio Access Node: As used herein, a "radio access node" is any node in a radio access network of a cellular communications network that operates to wirelessly transmit and/or receive signals. Some examples of a radio access node include, but are not limited to, a base station (e.g., an enhanced or evolved Node B (eNB) in a Third Generation Partnership Project (3GPP) Long Term Evolution (LTE) network or a Fifth Generation (5G) New Radio (NR) base station, which is referred to as a gNB), a high-power or macro base station, a low-power base station (e.g., a micro base station, a pico base station, a home eNB, or the like), and a relay node.

Core Network Node: As used herein, a "core network node" is any type of node in a core network. Some examples of a core network node include, e.g., a Mobility Management Entity (MME), a Packet Data Network Gateway (P-GW), a Service Capability Exposure Function (SCEF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the core network of a cellular communications network/system.

Note that the description given herein focuses on a 3GPP cellular communications system and, as such, 3GPP LTE or NR terminology or terminology similar to 3GPP LTE or NR terminology is oftentimes used. However, the concepts disclosed herein are not limited to LTE, NR, or a 3GPP system.

As disclosed herein, methods, systems and apparatus are disclosed for adding a bit-interleaver between a linear outer code (e.g., the Cyclic Redundancy Check (CRC) code) and a polar inner code. Such an interleaver allows some of the parity bits generated by the outer code to be used earlier to positively influence the decisions made in a modified Successive Cancellation List (SCL) decoder for the polar inner code. According to an exemplary advantage, this allows a single-step decoding for the overall concatenated code while outperforming its two-step counterpart.

As described herein, the design of the interleaver can be achieved by row and column permutations of a systematic generating matrix of the linear outer code. Given the resulting interleaving mapping, a modified SCL decoder can decode the inner polar code while taking into account the parity bits generated by the linear outer code.

According to various embodiments, an advantage of features herein is to enable a single-step decoding process for the concatenation of any linear outer code and a polar inner code through a judicious design of the interleaver, as opposed to a two-step decoding process where the inner polar code is first decoded followed by the decoding of the outer code. Such a single-step decoding jointly takes into account the structure of the polar inner code and the linear outer code and thus improves the performance, compared to the two-step solution. It also reduces the amount of interfacing needed in hardware and thus the overall decoding latency.

In addition, CRC checking can be done bit-by-bit for each individual CRC bit. This is in contrast to existing methods where the entire length-$K_{CRC}$ vector of CRC bits are used in CRC checking, where $K_{CRC}$ denotes the number of parity bits or CRC bits generated by the CRC code.

The CRC checking can be performed during the SCL decoding. This is in contrast to existing methods which performs CRC checking only at the end of SCL decoding.

Various other features and advantages will become obvious to one of ordinary skill in the art in light of the following detailed description and drawings.

Figure 2:
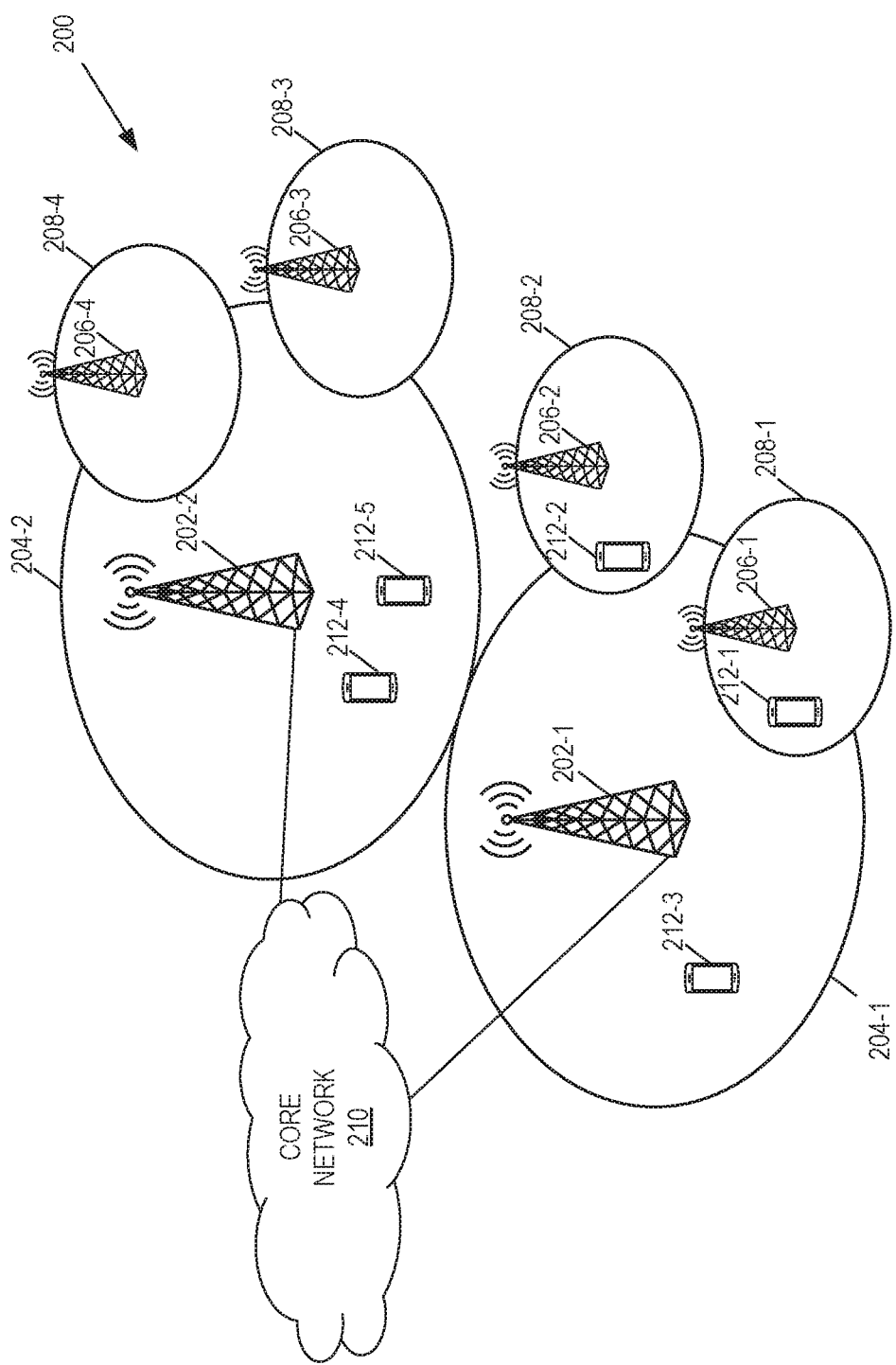
FIG. 2 illustrates one example of a cellular communications network according to some embodiments of the present disclosure.

FIG. 2 illustrates one example of a cellular communications network 200 according to some embodiments of the present disclosure. In the embodiments described herein, the cellular communications network 200 is a 5G NR network. In this example, the cellular communications network 200 includes base stations 202-1 and 202-2, which in LTE are referred to as eNBs and in 5G NR are referred to as gNBs, controlling corresponding macro cells 204-1 and 204-2. The base stations 202-1 and 202-2 are generally referred to herein collectively as base stations 202 and individually as base station 202. Likewise, the macro cells 204-1 and 204-2 are generally referred to herein collectively as macro cells 204 and individually as macro cell 204. The cellular communications network 200 also includes a number of low power nodes 206-1 through 206-4 controlling corresponding small cells 208-1 through 208-4. The low power nodes 206-1 through 206-4 can be small base stations (such as pico or femto base stations) or Remote Radio Heads (RRHs), or the like. Notably, while not illustrated, one or more of the small cells 208-1 through 208-4 may alternatively be provided by the base stations 202. The low power nodes 206-1 through 206-4 are generally referred to herein collectively as low power nodes 206 and individually as low power node 206. Likewise, the small cells 208-1 through 208-4 are generally referred to herein collectively as small cells 208 and individually as small cell 208. The base stations 202 (and optionally the low power nodes 206) are connected to a core network 210.

The base stations 202 and the low power nodes 206 provide service to wireless devices 212-1 through 212-5 in the corresponding cells 204 and 208. The wireless devices 212-1 through 212-5 are generally referred to herein collectively as wireless devices 212 and individually as wireless device 212. The wireless devices 212 are also sometimes referred to herein as UEs.

Various network nodes can perform the functionality described below. For example, an access node (e.g., an eNB or gNB), such as the base station 202 or 206, could perform the various interleaving steps provided herein. One of ordinary skill in the art would realize that a receiver (e.g., a receiver at a wireless device 212 or UE) would be able to perform the corresponding decoding, according to one example. Of course, it would be readily understood by one of ordinary skill in the art that various combinations of radio nodes could be implemented to perform the functionality described herein.

Various embodiments described herein are directed to adding a judiciously designed interleaver between the concatenation of a linear outer code and a polar inner code such that a single-pass or single-step decoding can be done using a slightly modified SCL polar decoder to jointly exploit the structure of both the inner and outer coder. Such an interleaver allows some of the parity bits generated by the outer code to be used earlier to positively influence the decisions made in a modified SCL decoder for the polar inner code. This allows a single-step decoding for the overall concatenated code while outperforming its two-step counterpart.

Since the interleaver may be an important aspect of features herein, details are also provided on how the design of the interleaver can be achieved by row and column permutations of a systematic generating matrix of the linear outer code.

According to an embodiment, an interleaver can be added between a linear outer code, such as a CRC code, and a polar inner code to facilitate list decoding for the inner polar code that takes into account the dependency structure of the parity bits and the data bits from the outer code. The encoder structure of the overall proposed code is illustrated in FIG. 3.

Figure 3:
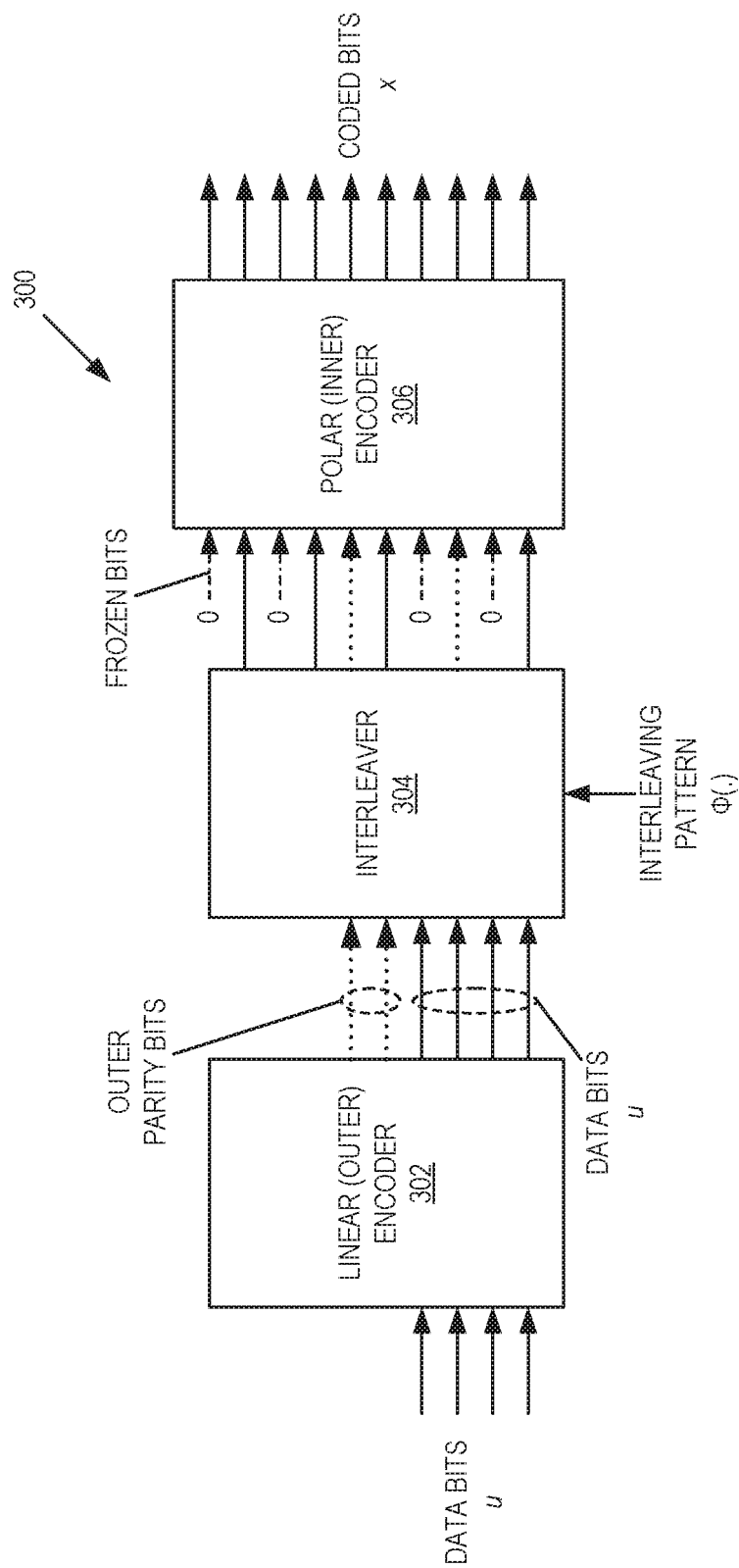
FIG. 3 is an illustration of an encoder structure of an interleaved concatenated polar code, according to an embodiment of the present disclosure.

In this regard, FIG. 3 illustrates an interleaved concatenated polar encoder 300 in accordance with some embodiments of the present disclosure. The interleaved concatenated polar encoder 300 is implemented at a radio node such as, e.g., a base station 202 or 204 or a wireless device 212. As illustrated, the interleaved concatenated polar encoder 300 includes a linear (outer) encoder 302, an interleaver 304, and a polar (inner) encoder 306. The linear encoder 302, the interleaver 304, and the polar encoder 306 may be implemented in hardware or a combination of hardware and software, as will be appreciated by one of ordinary skill in the art.

As shown in FIG. 3, the information-carrying data bits u (also referred to herein as data bits u) are first encoded by a linear outer code to generate some outer parity bits $p_{outer}$ along with the data bits u. All these bits $x_{outer}=[u|p_{outer}]$ are interleaved and put into the polar (inner) encoder 306 along with the frozen bits to generate the overall coded bits x. The interleaver 304 operates based on a predetermined interleaving mapping $\phi(\cdot)$.

Figure 4:
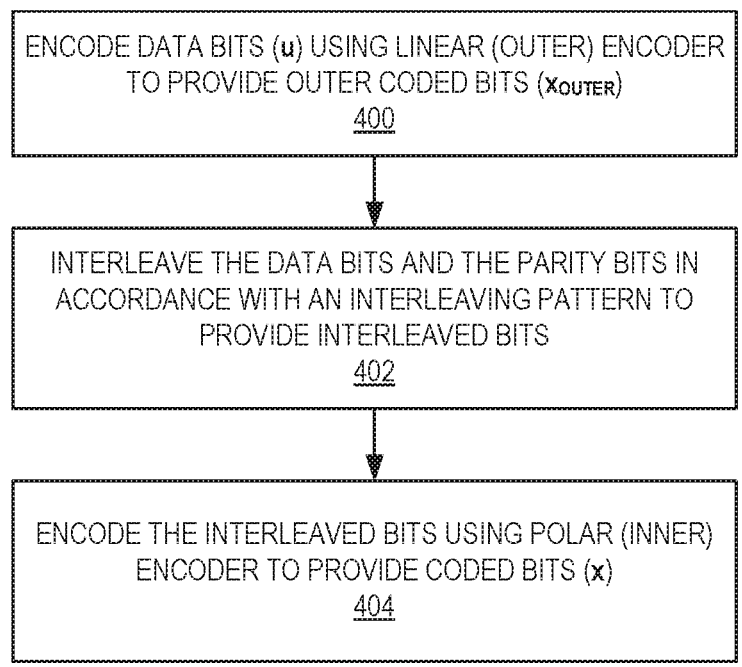
FIG. 4 is a flow chart that illustrates the operation of the encoder structure of FIG. 3 according to some embodiments of the present disclosure.

FIG. 4 is a flow chart that illustrates the operation of the interleaved concatenated polar encoder 300 of FIG. 3. This flow chart corresponds to the description of the operation of the interleaved concatenated polar encoder 300 provided above. As illustrated, the interleaved concatenated polar encoder 300 encodes the data bits u using the linear encoder 302 to provide first coded bits ($x_{outer}$) (step 400). As discussed herein, in some embodiments, the linear (outer) encoder 302 is a CRC encoder. The first coded bits ($x_{outer}$) form a sequence of bits that is a concatenation of the data bits (u) and a number of parity bits ($p_{outer}$) (i.e., $x_{outer}=[u|p_{outer}]$). The interleaver 304 interleaves the first coded bits ($x_{outer}$), and in particular interleaves the parity bits ($p_{outer}$) with the data bits (u) in accordance with the interleaving mapping $\phi(\cdot)$, to provide interleaved bits (step 402). As discussed herein, the interleaving mapping $\phi(\cdot)$ interleaves the parity bits ($p_{outer}$) with the data bits (u) and maps the resulting interleaved bits to the non-frozen inputs of the polar encoder 306. The polar encoder 306 then performs polar encoding of the interleaved bits and a number of frozen bits to provide the coded bits (x) (step 404).

As described herein, the interleaved bits are a sequence of bits comprising the parity bits ($p_{outer}$) interleaved with the data bits (u), where the interleaving mapping $\phi(\cdot)$ is such that at least one of the parity bits precedes at least one of the data bits in this sequence of bits. As also described herein, in some embodiments, each parity bit is a function of a respective subset of the data bits (u), and the interleaving mapping $\phi(\cdot)$ is such that at least one of the parity bits is at a position in the interleaved sequence of bits that is: (a) after all of the subset of the data bits of which the parity bit is a function and (b) before a last of the data bits in the interleaved sequence of bits. As also described herein, in some embodiments, each parity bit is a function of a respective subset of the data bits (u), and the interleaving mapping $\phi(\cdot)$ is such that at least one of the parity bits is at a position in the interleaved sequence of bits that is: (a) immediately after a last of the subset of the data bits of which the parity bit is a function within the interleaved sequence of bits and (b) before a last of the data bits in the interleaved sequence of bits. By positioning the parity bits within the interleaved sequence of bits in this manner, during decoding, at least some of the parity bits can be decoded before the last of the data bits is decoded and therefore used to positively influence the decoding process (e.g., by continuing on a particular branch of the SCL decoding process if a decoded parity bit is correct or discontinuing the particular branch of the SCL decoding process if the decoded parity bit is incorrect).

As also described below in detail, in some embodiments, encoding the data bits (u) using the linear encoder 302 includes encoding the data bits (u) using the linear encoder 302 in accordance with a generator matrix $G_{outer}=[I|P_{outer}]$, where I is an identity matrix of size K×K where K is the number of data bits in the plurality of data bits and $P_{outer}$ is a parity matrix that defines each of the plurality of parity bits as a function of a respective subset of the plurality of data bits. Further, the interleaving mapping $\phi(\cdot)$ is defined as $\phi=b\circ\phi_c$, where b is a bit mapping that maps the plurality of interleaved bits to the plurality of non-frozen inputs of the polar encoder and $\phi_c$ is a column permutation mapping of a column permutation matrix $\Phi_c$ that, together with a row permutation matrix $\Phi_r$, provide $G'_{outer} \triangleq \Phi_r G_{outer} \Phi_c^T$, where $G'_{outer}$ is an upper block-triangular matrix with exactly K being those of the identity matrix I.

Figure 5:
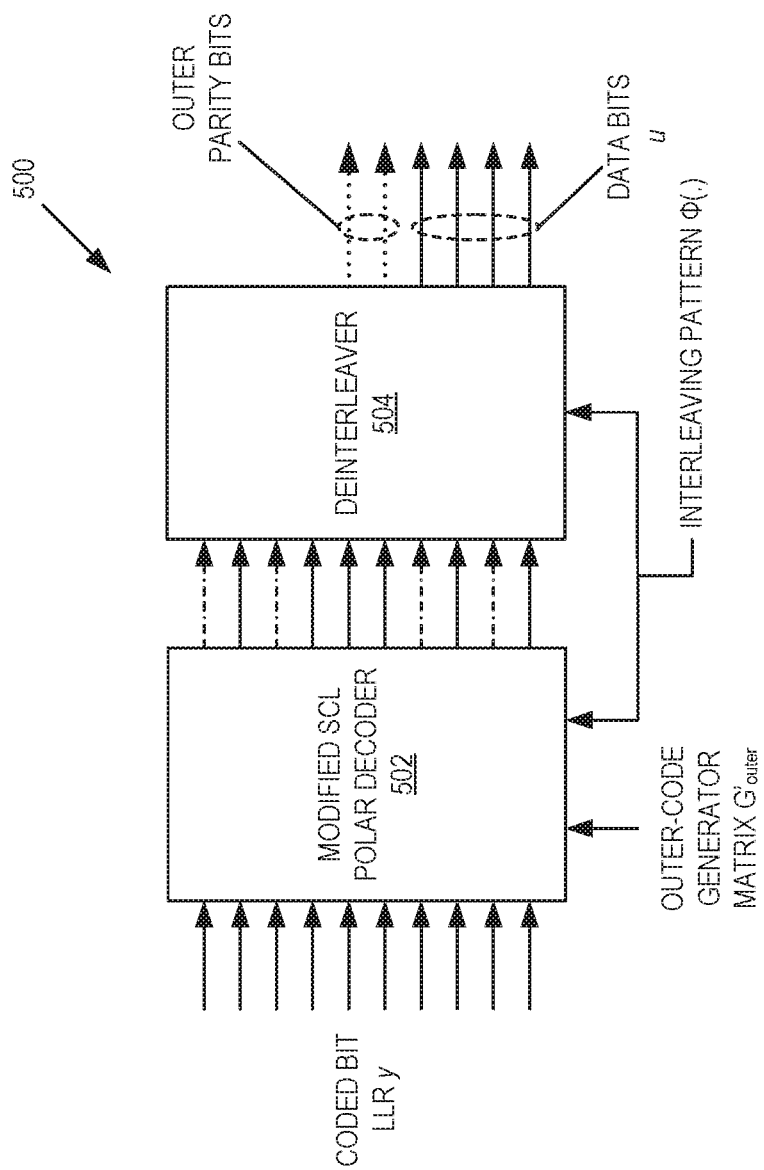
FIG. 5 is an Illustration of a one-step decoder structure for an interleaved concatenated polar code, according to an embodiment of the present disclosure.
Figure 6:
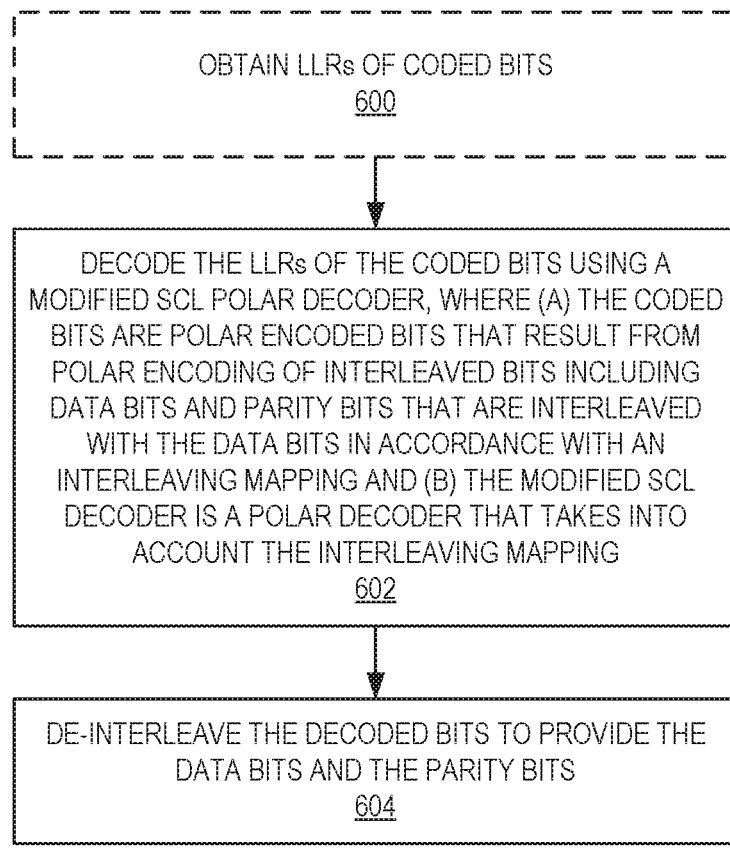
FIG. 6 is a flow chart that illustrates the operation of the decoder structure of FIG. 5 according to some embodiments of the present disclosure.

While FIGS. 3 and 4 focus on the operation of the interleaved concatenated polar encoder 300 at the transmitter, FIGS. 5 and 6 describe a one-step decoder 500 and the operation thereof at the receiver. At the receiver, the structure of the one-step decoder 500 is illustrated in FIG. 5, where the input Log-Likelihood Ratios (LLRs) y of the coded bits are first decoded using a modified SCL polar decoder 502, whose outputs are then passed through a deinterleaver 504 that extract the decoded data bits u. The deinterleaver 504 depends on the interleaving mapping $\phi(\cdot)$ used in the interleaved concatenated polar encoder 300. The operations of the modified SCL polar decoder 502 are similar to an ordinary SCL polar decoder except that whenever an outer parity bit is reached, as indicated by the interleaving mapping $\phi(\cdot)$, during the successive decoding process, its value is computed based on the previous data bits as indicated by the corresponding columns of the generating matrix of the outer code.

FIG. 6 is a flow chart that illustrates the operation of the one-step decoder 500 of FIG. 5. This flow chart corresponds to the description of the operation of the one-step decoder 500 provided above. As illustrated, the one-step decoder 500 (optionally) obtains LLRs of the coded bits (e.g., in the conventional manner) (step 600). The modified SCL polar decoder 502 decodes the LLRs of the coded bits to provides decoded bits (step 602). The coded bits are polar encoded bits that result from polar encoding of interleaved bits including data bits (u) and parity bits ($p_{outer}$) interleaved with the data bits (u) in accordance with the interleaving mapping $\phi(\cdot)$, as described above. The modified SCL polar decoder 502 is a SCL polar decoder that takes into account the interleaving mapping $\phi(\cdot)$. More specifically, as discussed above, the operations of the modified SCL polar decoder 502 are similar to an ordinary SCL polar decoder except that whenever an outer parity bit is reached, as indicated by the interleaving mapping $\phi(\cdot)$, during the successive decoding process, its value is computed based on the previous data bits as indicated by the corresponding columns of the generating matrix of the outer code.

The decoded bits include the parity bits ($p_{outer}$) interleaved with the data bits (u). As such, the deinterleaver 504 deinterleaves the data bits (u) and the parity bits ($p_{outer}$) (step 604).

Figure 7:
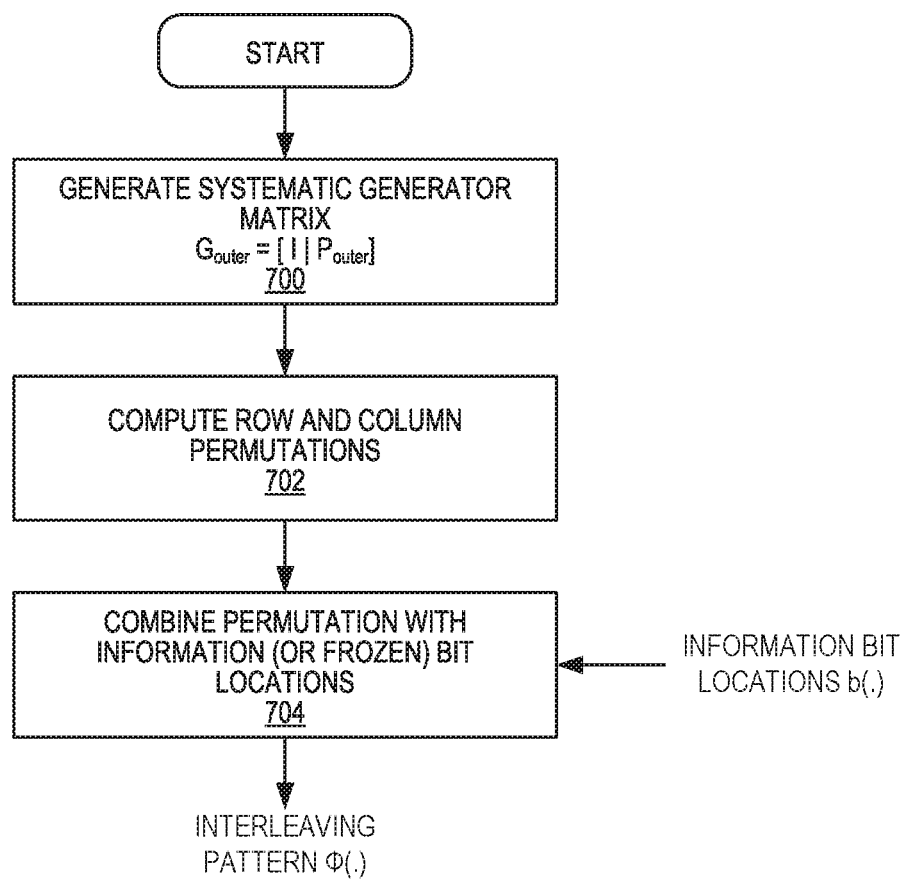
FIG. 7 is a flow diagram of a design of an interleaver, according to an exemplary embodiment of the present disclosure.

A description of the design of the interleaver 304 and, in particular the interleaving mapping $\phi(\cdot)$, in accordance with some embodiments of the present disclosure will now be provided. A generic procedure is described herein for designing the interleaving mapping $\phi(\cdot)$ (and thus the interleaver 304) that optimizes the performance of one-step decoding of the concatenated code for any given linear block code as the outer code. While the outer code can be any linear block code in general, in this example, the outer code is assumed to be a CRC code. The same principle can be extended to cover other types of outer codes. A flow diagram for this procedure is illustrated in FIG. 7.

Step 700: a $K \times (K+K_{CRC})$ systematic generator matrix $G_{outer}=[I|P_{outer}]$ of the outer code is first obtained, where I and $P_{outer}$ denote the identity matrix and the corresponding parity matrix of the outer code.

Step 702: Compute row and column permutation matrices, $\Phi_r$ and $\Phi_c$, which are determined such that $$G'_{outer} \triangleq \Phi_r G_{outer} \Phi_c^T$$

is an upper block-triangular matrix with exactly K columns being those of the identity matrix I. Let $\phi_r: \{1,2,\ldots,K\} \rightarrow \{1,2,\ldots,K\}$ and $\phi_c: \{1,2,\ldots,K+K_{CRC}\} \rightarrow \{1,2,\ldots,K+K_{CRC}\}$ be the corresponding row and column permutation mappings of $\Phi_r$ and $\Phi_c$, respectively.

Step 704: Combine the column permutation mapping $\Phi_c$ and the information bit mapping b: $\{1,2,\ldots,K+K_{CRC}\} \rightarrow \{1,2,\ldots,N\}$ of the inner polar code that maps the output of the interleaver to the input of the polar (inner) encoder 306 to form the desired interleaving mapping $\phi=b \circ \phi_c$, where N denotes the code length of the inner polar code.

A preferred embodiment is to use a CRC code as the outer code. Below is an illustration using an example of how the interleaving mapping that improves one-step decoding performance can be obtained. It should be known by those skilled in the art that the design of the interleaving mapping need not be confined by the method illustrated. From this example, other design methods can be similarly derived to construct an interleaver that re-locates some CRC bits to earlier positions in the successive decoding process.

First, it is illustrated how the generating matrix of CRC code can be obtained from the CRC generating polynomial. Let $g_{CRC}(D)$ denote the generating polynomial of the CRC code. For LTE downlink control channels, 16-bit CRC is generated via the generator polynomial: $g_{CRC}(D)=D^{16}+D^{12}+D^5+1$. The ith row of the corresponding systematic generating matrix $G_{outer}=[I|P_{outer}]$ that satisfies $uG_{outer}=x_{outer}$, where u and $x_{outer}$ denote the data bit vector and the CRC coded bit vector, respectively, can be obtained by taking a long division of $D^{K-i+1}$ by $g_{CRC}(D)$, for each $i=1,2,\ldots,K$, where K denotes the number of data bits.

For example, for $K=K_{CRC}=8$ and $g_{CRC}(D)=D^8+D^7+D^4+D^3+D+1$, there is:

$$G_{outer} = \begin{bmatrix} 1 & 0 & 0 & 0 & 0 & 0 & 0 & 0 & 0 & 0 & 0 & 1 & 0 & 1 & 1 \\ 0 & 1 & 0 & 0 & 0 & 0 & 0 & 0 & 1 & 1 & 0 & 0 & 1 & 0 & 0 & 0 \\ 0 & 0 & 1 & 0 & 0 & 0 & 0 & 0 & 0 & 1 & 1 & 0 & 0 & 1 & 0 & 0 \\ 0 & 0 & 0 & 1 & 0 & 0 & 0 & 0 & 0 & 0 & 1 & 1 & 0 & 0 & 1 & 0 \\ 0 & 0 & 0 & 0 & 1 & 0 & 0 & 0 & 0 & 0 & 0 & 1 & 1 & 0 & 0 & 1 \\ 0 & 0 & 0 & 0 & 0 & 1 & 0 & 0 & 1 & 1 & 0 & 0 & 0 & 0 & 0 & 1 \\ 0 & 0 & 0 & 0 & 0 & 0 & 1 & 0 & 1 & 0 & 1 & 0 & 1 & 1 & 0 & 1 \\ 0 & 0 & 0 & 0 & 0 & 0 & 0 & 1 & 1 & 0 & 0 & 1 & 1 & 0 & 1 & 1 \end{bmatrix} \quad (1)$$

$$\underbrace{\phantom{XXXXXXXXX}}_{I} \underbrace{\phantom{XXXXXXXXX}}_{P_{outer}}$$

Methods herein take into account the structure of the CRC outer code during the SCL decoding of the inner polar code. However, as shown in Eq. (1), any of the parity bits computed based on $P_{outer}$ may depend on any subsets of the information bits. For example, the parity bit that corresponds to the first column of $P_{outer}$ is a function of the information bits mapped to the second, sixth, seventh, and eighth rows of $G_{outer}$. As a result, all the parity bits need to be placed at the end of the decoding process. Since SCL decoding is sequential in nature, it is desirable to have parity bits depend on earlier bit decisions so that incorrect decision paths can be eliminated earlier. For the CRC outer code, it is desirable that CRC bit j depends only on bit decisions that are made prior to processing of the CRC bit j.

This can be achieved to some extent by permuting the rows and columns of $G_{outer}=[I|P_{outer}]$. Specifically, it is possible to transform it into $\overline{G}_{outer}=[I|\overline{P}_{outer}]$, where $\overline{P}_{outer}$ is an upper block triangular matrix. In the above example, Eq. (1) can be transformed into $$\overline{G}_{outer} = \begin{bmatrix} 1 & 0 & 0 & 0 & 0 & 0 & 0 & 0 & 1 & 1 & 1 & 0 & 0 & 0 & 0 & 0 \\ 0 & 1 & 0 & 0 & 0 & 0 & 0 & 0 & 1 & 1 & 0 & 1 & 0 & 1 & 0 & 1 \\ 0 & 0 & 1 & 0 & 0 & 0 & 0 & 0 & 0 & 1 & 0 & 0 & 1 & 0 & 1 & 0 \\ 0 & 0 & 0 & 1 & 0 & 0 & 0 & 0 & 0 & 0 & 1 & 1 & 0 & 1 & 0 & 0 \\ 0 & 0 & 0 & 0 & 1 & 0 & 0 & 0 & 0 & 0 & 1 & 1 & 0 & 0 & 0 & 1 \\ 0 & 0 & 0 & 0 & 0 & 1 & 0 & 0 & 0 & 0 & 0 & 1 & 1 & 1 & 1 & 1 \\ 0 & 0 & 0 & 0 & 0 & 0 & 1 & 0 & 0 & 0 & 0 & 0 & 1 & 1 & 0 & 1 \\ 0 & 0 & 0 & 0 & 0 & 0 & 0 & 1 & 0 & 0 & 0 & 0 & 0 & 1 & 1 & 1 \end{bmatrix}, \quad (2)$$

where the entries in bold are those of $\overline{P}_{outer}$, when the rows and columns are permuted, respectively, according to the following permutation mappings:

$\phi_c$=[3 7 4 2 6 8 5 1 14 11 10 9 12 13 15 16], and $\phi_r$=[3 7 4 2 6 8 5 1].

In the above example, Eq. (2) can be further transformed into $$G'_{outer} = \begin{bmatrix} 1 & 0 & 1 & 0 & 1 & 0 & 0 & 1 & 0 & 0 & 0 & 0 & 0 & 0 & 0 & 0 \\ 0 & 1 & 1 & 0 & 1 & 0 & 0 & 0 & 0 & 1 & 0 & 0 & 0 & 1 & 0 & 1 \\ 0 & 0 & 0 & 1 & 1 & 0 & 0 & 0 & 0 & 0 & 1 & 0 & 0 & 1 & 0 & 0 \\ 0 & 0 & 0 & 0 & 0 & 1 & 0 & 1 & 0 & 1 & 0 & 0 & 0 & 1 & 0 & 0 \\ 0 & 0 & 0 & 0 & 0 & 0 & 1 & 1 & 0 & 1 & 0 & 0 & 0 & 0 & 0 & 1 \\ 0 & 0 & 0 & 0 & 0 & 0 & 0 & 0 & 1 & 1 & 0 & 1 & 0 & 1 & 1 & 1 \\ 0 & 0 & 0 & 0 & 0 & 0 & 0 & 0 & 0 & 0 & 1 & 1 & 0 & 1 & 0 & 1 \\ 0 & 0 & 0 & 0 & 0 & 0 & 0 & 0 & 0 & 0 & 0 & 0 & 1 & 1 & 1 & 1 \end{bmatrix} \quad (3)$$

where the entries in bold are those of $\overline{P}_{outer}$, when the columns are permuted according to the permutation mapping:

$\phi_c$=[3 7 14 4 11 2 6 10 8 9 5 12 1 13 15 16], which defines the corresponding column permutation mapping $\phi_c(\cdot)$. Note that $G'_{outer}$ is an upper block triangular matrix.

Given the information bit mapping b: {1,2, ..., K+$K_{CRC}$}→{1,2, ..., N} for the inner polar code, the overall interleaving mapping is given by $\phi(k)=b(\phi_c(k))$ for $k \in \{1,2, \ldots, K+K_{CRC}\}$.

The interleaving mapping of this example enables the first parity bit, which corresponds to the third column of $G'_{outer}$ and is a function of only the first and second information bits, to be checked immediately after decisions are made for the first and second information bits. Checking of the first parity bit does not need to wait until decisions for all information bits have been made. As a result, the CRC checking can be done for the first parity bit early in the decoding process. If the CRC check for the first parity bit fails, then decoding for this particular decision path can end. If the CRC check for the first parity bit passes, then decoding for this particular decision path continues until the second parity bit is reached. A CRC check is then performed for the second parity bit, and so on. If all decision paths are ended due to failure to pass CRC check, the decoder can end the entire decoding process and declare that an erred code block is detected. In this manner, the parity bits can be considered earlier in the decoding process to influence the decoding in a positive manner in terms of reducing average decoding time.

The proposed designs, or other variant designs, include at least the following features and benefits:
  a. CRC checking can be done bit-by-bit for each individual CRC bit. This is in contrast to existing methods where the entire length-$K_{CRC}$ vector of CRC bits are used in CRC checking;
  b. The CRC checking can be performed during the SCL decoding. This is in contrast to existing methods which performs CRC checking only at the end of SCL decoding.

Figure 8:
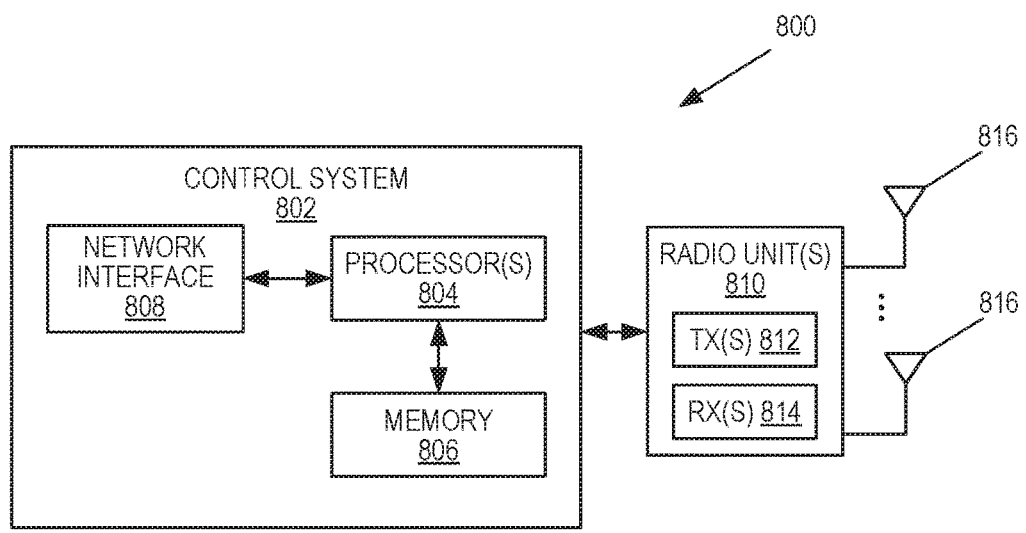
FIG. 8 is an exemplary block diagram of a radio access node, according to various exemplary embodiments of the present disclosure.

FIG. 8 is a schematic block diagram of a radio access node 800 according to some embodiments of the present disclosure. The radio access node 800 may be, for example, a base station 202 or 206. As illustrated, the radio access node 800 includes a control system 802 that includes one or more processors 804 (e.g., Central Processing Units (CPUs), Application Specific Integrated Circuits (ASICs), Field Programmable Gate Arrays (FPGAs), and/or the like), memory 806, and a network interface 808. In addition, the radio access node 800 includes one or more radio units 810 that each includes one or more transmitters 812 and one or more receivers 814 coupled to one or more antennas 816. In some embodiments, the radio unit(s) 810 is external to the control system 802 and connected to the control system 802 via, e.g., a wired connection (e.g., an optical cable). However, in some other embodiments, the radio unit(s) 810 and potentially the antenna(s) 816 are integrated together with the control system 802. The one or more processors 804 operate to provide one or more functions of a radio access node 800 as described herein. In some embodiments, the function(s) are implemented in software that is stored, e.g., in the memory 806 and executed by the one or more processors 804.

Figure 9:
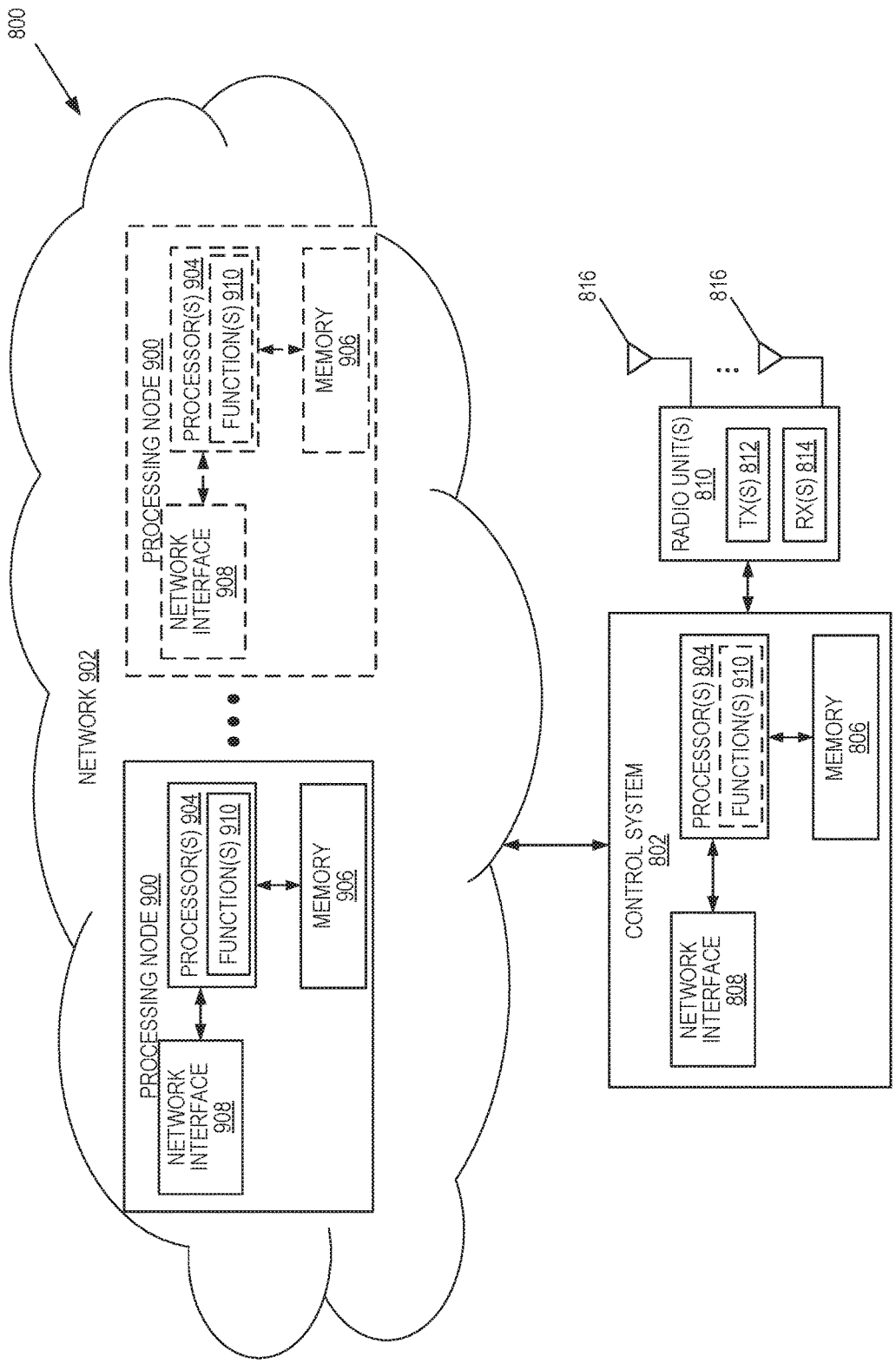
FIG. 9 is an exemplary block diagram of an embodiment of a radio access node, according to various embodiments of the present disclosure.

FIG. 9 is a schematic block diagram that illustrates a virtualized embodiment of the radio access node 800 according to some embodiments of the present disclosure. This discussion is equally applicable to other types of network nodes. Further, other types of network nodes may have similar virtualized architectures.

As used herein, a "virtualized" radio access node is an implementation of the radio access node 800 in which at least a portion of the functionality of the radio access node 800 is implemented as a virtual component(s) (e.g., via a virtual machine(s) executing on a physical processing node (s) in a network(s)). As illustrated, in this example, the radio access node 800 includes the control system 802 that includes the one or more processors 804 (e.g., CPUs, ASICs, FPGAs, and/or the like), the memory 806, and the network interface 808 and the one or more radio units 810 that each includes the one or more transmitters 812 and the one or more receivers 814 coupled to the one or more antennas 816, as described above. The control system 802 is connected to the radio unit(s) 810 via, for example, an optical cable or the like. The control system 802 is connected to one or more processing nodes 900 coupled to or included as part of a network(s) 902 via the network interface 808. Each processing node 900 includes one or more processors 904 (e.g., CPUs, ASICs, FPGAs, and/or the like), memory 906, and a network interface 908.

In this example, functions 910 of the radio access node 800 described herein are implemented at the one or more processing nodes 900 or distributed across the control system 802 and the one or more processing nodes 900 in any desired manner. In some particular embodiments, some or all of the functions 910 of the radio access node 800 described herein are implemented as virtual components executed by one or more virtual machines implemented in a virtual environment(s) hosted by the processing node(s) 900. As will be appreciated by one of ordinary skill in the art, additional signaling or communication between the processing node(s) 900 and the control system 802 is used in order to carry out at least some of the desired functions 910. Notably, in some embodiments, the control system 802 may not be included, in which case the radio unit(s) 810 communicate directly with the processing node(s) 900 via an appropriate network interface(s).

In some embodiments, a computer program including instructions which, when executed by at least one processor, causes the at least one processor to carry out the functionality of radio access node 800 or a node (e.g., a processing node 900) implementing one or more of the functions 910 of the radio access node 800 in a virtual environment according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 10:
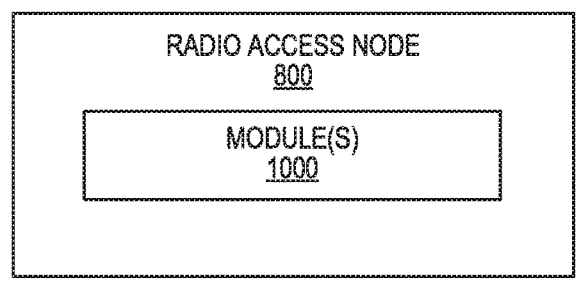
FIG. 10 is a diagram of an exemplary virtualized radio access node, according to various embodiments described herein.

FIG. 10 is a schematic block diagram of the radio access node 800 according to some other embodiments of the present disclosure. The radio access node 800 includes one or more modules 1000, each of which is implemented in software. The module(s) 1000 provide the functionality of the radio access node 800 described herein. This discussion is equally applicable to the processing node 900 of FIG. 9 where the modules 1000 may be implemented at one of the processing nodes 900 or distributed across multiple processing nodes 900 and/or distributed across the processing node(s) 900 and the control system 802.

Figure 11:
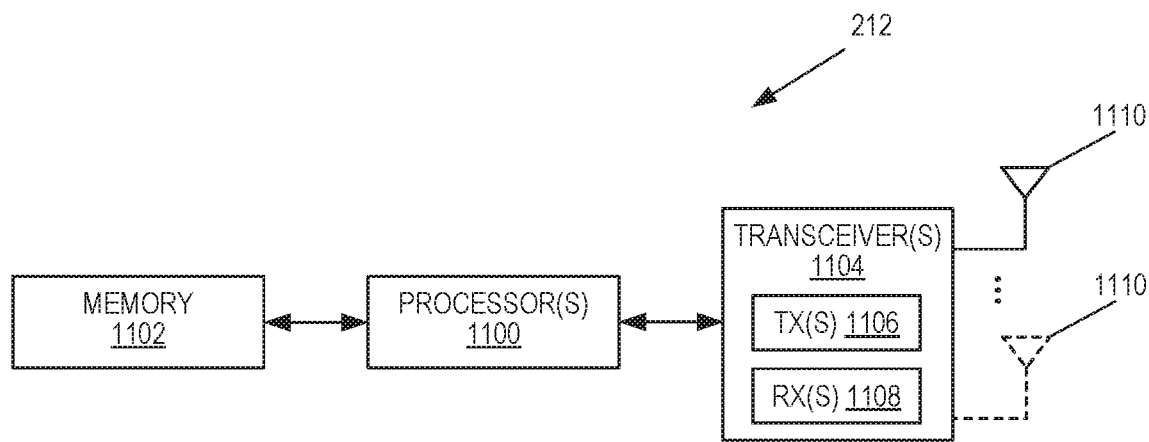
FIG. 11 is a block diagram of an exemplary User Equipment device (UE), according to various embodiments described herein.

FIG. 11 is a schematic block diagram of a UE 212 according to some embodiments of the present disclosure. As illustrated, the UE 212 includes one or more processors 1100 (e.g., CPUs, ASICs, FPGAs, and/or the like), memory 1102, and one or more transceivers 1104 each including one or more transmitters 1106 and one or more receivers 1108 coupled to one or more antennas 1110. In some embodiments, the functionality of the UE 212 described above may be fully or partially implemented in software that is, e.g., stored in the memory 1102 and executed by the processor(s) 1100.

In some embodiments, a computer program including instructions which, when executed by at least one processor, causes the at least one processor to carry out the functionality of the UE 212 according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 12:
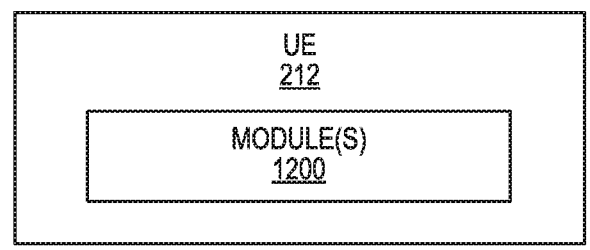
FIG. 12 is a block diagram of an exemplary UE, according to various embodiments described herein.

FIG. 12 is a schematic block diagram of the UE 212 according to some other embodiments of the present disclosure. The UE 212 includes one or more modules 1200, each of which is implemented in software. The module(s) 1200 provide the functionality of the UE 212 described herein.

While processes in the figures may show a particular order of operations performed by certain embodiments of the present disclosure, it should be understood that such order is exemplary (e.g., alternative embodiments may perform the operations in a different order, combine certain operations, overlap certain operations, etc.).

While the present disclosure has been described in terms of several embodiments, those skilled in the art will recognize that the present disclosure is not limited to the embodiments described, can be practiced with modification and alteration within the spirit and scope of the appended claims. The description is thus to be regarded as illustrative instead of limiting.

At least some of the following abbreviations may be used in this disclosure. If there is an inconsistency between abbreviations, preference should be given to how it is used above. If listed multiple times below, the first listing should be preferred over any subsequent listing(s).

3GPP Third Generation Partnership Project
5G Fifth Generation
ASIC Application Specific Integrated Circuit
CPU Central Processing Unit
CRC Cyclic Redundancy Check
eNB Enhanced or Evolved Node B
FPGA Field Programmable Gate Array
gNB New Radio Base Station
LDPC Low-Density Parity-Check
LLR Log-Likelihood Ratio
LTE Long Term Evolution
ML Maximum-Likelihood
MME Mobility Management Entity
MTC Machine-Type Communication
NR New Radio
P-GW Packet Data Network Gateway
RRH Remote Radio Head
SC Successive Cancellation
SCEF Service Capability Exposure Function
SCL Successive Cancellation List
UE User Equipment Those skilled in the art will recognize improvements and modifications to the embodiments of the present disclosure. All such improvements and modifications are considered within the scope of the concepts disclosed herein.

REFERENCES

[1] E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009.
[2] I. Tal and A. Vardy, "List Decoding of polar codes," in Proceedings of IEEE Symp. Inf. Theory, pp. 1-5, 2011.

What is claimed is:

1. A method of operation of a radio node to perform encoding of a plurality of data bits for transmission by the radio node, comprising:
   encoding the plurality of data bits using a linear encoder to provide a first plurality of coded bits, the first plurality of coded bits comprising a plurality of parity bits and the plurality of data bits, where the plurality of parity bits are a single parity check code;
   interleaving the first plurality of coded bits in accordance with an interleaving mapping to provide a plurality of interleaved bits; and
   encoding the plurality of interleaved bits using a polar encoder to provide a second plurality of coded bits to be transmitted by the radio node;
   wherein encoding the plurality of data bits using the linear encoder comprises encoding the plurality of data bits in accordance with a generator matrix $G_{outer}=[I|P_{outer}]$, where I is an identity matrix of size K×K where K is a number of data bits in the plurality of data bits and $P_{outer}$ is a parity matrix that defines each of the plurality of parity bits as a function of a respective subset of the plurality of data bits such that $uG_{outer}=x_{outer}$ where u and $x_{outer}$ denote the plurality of data bits and the first plurality of coded bits, respectively; and
   the interleaving mapping is defined as $\phi=b\circ\phi_c$, where:
   ∘ denotes a composition operator for mappings;
   b is a bit mapping that maps the plurality of interleaved bits to a plurality of non-frozen inputs of the polar encoder; and
   $\phi_c$ is a column permutation mapping of a column permutation matrix $\Phi_c$ that, together with a row permutation matrix $\Phi_r$, provide $G'_{outer} \triangleq \Phi_r G_{outer} \Phi_c^T$, where $G'_{outer}$ is an upper block-triangular matrix with exactly K columns being those of the identity matrix I.

2. The method of claim 1 wherein the interleaving mapping maps the plurality of interleaved bits to inputs of the polar encoder.

3. The method of claim 1 wherein the plurality of interleaved bits is a sequence of bits comprising the plurality of parity bits interleaved with the plurality of data bits, and the interleaving mapping is such that at least one of the plurality of parity bits precedes at least one of the plurality of data bits in the sequence of bits.

4. The method of claim 1 wherein:
the plurality of interleaved bits is a sequence of bits comprising the plurality of parity bits interleaved with the plurality of data bits;
each parity bit of the plurality of parity bits is the function of the respective subset of the plurality of data bits; and
the interleaving mapping is such that at least one of the plurality of parity bits is at a position in the sequence of bits that is: (a) after all of the subset of the plurality of data bits of which the at least one of the plurality of parity bits is the function and (b) before a last of the plurality of data bits within the sequence of bits.

5. The method of claim 1 wherein:
the plurality of interleaved bits is a sequence of bits comprising the plurality of parity bits interleaved with the plurality of data bits;
each parity bit of the plurality of parity bits is the function of the respective subset of the plurality of data bits; and
the interleaving mapping is such that at least one of the plurality of parity bits is at a position in the sequence of bits that is: (a) immediately after a last of the subset of the plurality of data bits of which the at least one of the plurality of parity bits is the function within the sequence of bits and (b) before a last of the plurality of data bits within the sequence of bits.

6. The method of claim 1 wherein the linear encoder is a Cyclic Redundancy Check, CRC, encoder.

7. A radio node for performing encoding of a plurality of data bits for transmission by the radio node, the radio node comprising:
a transmitter; and
at least one processor operable to:
encode the plurality of data bits using a linear encoder to provide a first plurality of coded bits, the first plurality of coded bits comprising a plurality of parity bits and the plurality of data bits, where the plurality of parity bits are a single parity check code;
interleave the first plurality of coded bits in accordance with an interleaving mapping to provide a plurality of interleaved bits; and
encode the plurality of interleaved bits and one or more frozen bits using a polar encoder to provide a second plurality of coded bits to be transmitted by the radio node;
wherein being operable to encode the plurality of data bits using the linear encoder comprises being operable to encode the plurality of data bits in accordance with a generator matrix $G_{outer} = [I|P_{outer}]$, where I is an identity matrix of size K×K where K is a number of data bits in the plurality of data bits and $P_{outer}$ is a parity matrix that defines each of the plurality of parity bits as a function of a respective subset of the plurality of data bits such that $uG_{outer} = x_{outer}$ where u and $x_{outer}$ denote the plurality of data bits and the first plurality of coded bits, respectively; and
the interleaving mapping is defined as $\phi = b \circ \phi_c$, where:
○ denotes a composition operator for mappings;
b is a bit mapping that maps the plurality of interleaved bits to a plurality of non-frozen inputs of the polar encoder; and
$\phi_c$ is a column permutation mapping of a column permutation matrix $\Phi_c$ that, together with a row permutation matrix $\Phi_r$, provide $G'_{outer} \triangleq \Phi_r G_{outer} \Phi_c^T$, where $G'_{outer}$ is an upper block-triangular matrix with exactly K columns being those of the identity matrix I.

8. The radio node of claim 7 wherein the interleaving mapping maps the plurality of interleaved bits to inputs of the polar encoder.

9. The radio node of claim 7 wherein the plurality of interleaved bits is a sequence of bits comprising the plurality of parity bits interleaved with the plurality of data bits, and the interleaving mapping is such that at least one of the plurality of parity bits precedes at least one of the plurality of data bits in the sequence of bits.

10. The radio node of claim 7 wherein:
the plurality of interleaved bits is a sequence of bits comprising the plurality of parity bits interleaved with the plurality of data bits;
each parity bit of the plurality of parity bits is the function of the respective subset of the plurality of data bits; and
the interleaving mapping is such that at least one of the plurality of parity bits is at a position in the sequence of bits that is: (a) after all of the subset of the plurality of data bits of which the at least one of the plurality of parity bits is the function and (b) before a last of the plurality of data bits within the sequence of bits.

11. The radio node of claim 7 wherein:
the plurality of interleaved bits is a sequence of bits comprising the plurality of parity bits interleaved with the plurality of data bits;
each parity bit of the plurality of parity bits is the function of the respective subset of the plurality of data bits; and
the interleaving mapping is such that at least one of the plurality of parity bits is at a position in the sequence of bits that is: (a) immediately after a last of the subset of the plurality of data bits of which the at least one of the plurality of parity bits is the function within the sequence of bits and (b) before a last of the plurality of data bits within the sequence of bits.

12. The radio node of claim 7 wherein the linear encoder is a Cyclic Redundancy Check, CRC, encoder.

13. A method of operation of a radio node to perform decoding of a plurality of coded bits received by the radio node, comprising:
decoding a plurality of coded data bits using a polar decoder to provide a plurality of decoded bits, the plurality of decoded bits comprising a plurality of parity bits interleaved with a plurality of data bits, where the plurality of parity bits are a single parity check code; and
deinterleaving the plurality of decoded bits in accordance with an interleaving mapping to thereby provide the plurality of parity bits and the plurality of data bits;
wherein decoding the plurality of coded data bits comprises decoding the plurality of coded data bits in accordance with a generator matrix $G_{outer} = [I|P_{outer}]$, where I is an identity matrix of size K×K where K is a number of data bits in the plurality of data bits and $P_{outer}$ is a parity matrix that defines each of the plurality of parity bits as a function of a respective subset of the plurality of data bits such that $uG_{outer} = x_{outer}$ where u and $x_{outer}$ denote the plurality of data bits and the first plurality of coded bits, respectively; and
the interleaving mapping is defined as $\phi = b \circ \phi_c$, where:
○ denotes a composition operator for mappings;
b is a bit mapping that maps the plurality of interleaved bits to a plurality of non-frozen inputs of the polar encoder; and
$\phi_c$ is a column permutation mapping of a column permutation matrix $\Phi_c$ that, together with a row permutation matrix $\Phi_r$, provide $G_{outer} \triangleq \Phi_r G_{outer} \Phi_c^T$ where G'$_{outer}$ is an upper block-triangular matrix with exactly K columns being those of the identity matrix I.

14. The method of claim 13 wherein decoding the plurality of coded bits comprises decoding a plurality of input Log-Likelihood Ratios, LLRs, of the plurality of coded bits using a modified Successive Cancellation List, SCL, polar decoder, wherein:
   the plurality of coded bits is a plurality of polar encoded bits that result from a polar encoding of the plurality of interleaved bits comprising the plurality of data bits and the plurality of parity bits that are interleaved with the plurality of data bits in accordance with the interleaving mapping; and
   the modified SCL polar decoder is a SCL polar decoder that takes into account the interleaving mapping.

15. The method of claim 13 wherein the plurality of interleaved bits is a sequence of bits comprising the plurality of parity bits interleaved with the plurality of data bits, and the interleaving mapping is such that at least one of the plurality of parity bits precedes at least one of the plurality of data bits in the sequence of bits.

16. The method of claim 13 wherein:
   the plurality of interleaved bits is a sequence of bits comprising the plurality of parity bits interleaved with the plurality of data bits;
   each parity bit of the plurality of parity bits is the function of the respective subset of the plurality of data bits; and
   the interleaving mapping is such that at least one of the plurality of parity bits is at a position in the sequence of bits that is: (a) after all of the subset of the plurality of data bits of which the at least one of the plurality of parity bits is the function and (b) before a last of the plurality of data bits within the sequence of bits.

17. The method of claim 13 wherein:
   the plurality of interleaved bits is a sequence of bits comprising the plurality of parity bits interleaved with the plurality of data bits;
   each parity bit of the plurality of parity bits is the function of the respective subset of the plurality of data bits; and
   the interleaving mapping is such that at least one of the plurality of parity bits is at a position in the sequence of bits that is: (a) immediately after a last of the subset of the plurality of data bits of which the at least one of the plurality of parity bits is the function within the sequence of bits and (b) before a last of the plurality of data bits within the sequence of bits.

18. The method of claim 13 wherein the plurality of data bits and the plurality of parity bits are a result of Cyclic Redundancy Check, CRC, encoding of the plurality of data bits.

19. A radio node to perform decoding of a plurality of coded bits received by the radio node, comprising:
   a transmitter; and
   at least one processor operable to:
      decode a plurality of coded data bits using a polar decoder to provide a plurality of decoded bits, the plurality of decoded bits comprising a plurality of parity bits interleaved with a plurality of data bits, where the plurality of parity bits are a single parity check code; and
      deinterleave the plurality of decoded bits in accordance with an interleaving mapping to thereby provide the plurality of parity bits and the plurality of data bits;
      wherein being operable to decode the plurality of coded data bits comprises being operable to decode the plurality of coded data bits in accordance with a generator matrix $G_{outer}=[I|P_{outer}]$, where I is an identity matrix of size K×K where K is a number of data bits in the plurality of data bits and $P_{outer}$ is a parity matrix that defines each of the plurality of parity bits as a function of a respective subset of the plurality of data bits such that $uG_{outer}=x_{outer}$ where u and $x_{outer}$ denote the plurality of data bits and the first plurality of coded bits, respectively; and
   the interleaving mapping is defined as $\phi = b \circ \phi_c$, where:
      ○ denotes a composition operator for mappings;
      b is a bit mapping that maps the plurality of interleaved bits to a plurality of non-frozen inputs of the polar encoder; and
      $\phi_c$ is a column permutation mapping of a column permutation matrix $\Phi_c$ that, together with a row permutation matrix $\Phi_r$, provide $G'_{outer} \triangleq \Phi_r G_{outer} \Phi_c^T$, where G'$_{outer}$ is an upper block-triangular matrix with exactly K columns being those of the identity matrix I.

20. The radio node of claim 19 wherein, in order to decode the plurality of coded bits, the at least one processor is further operable to decode a plurality of input Log-Likelihood Ratios, LLRs, of the plurality of coded bits using a modified Successive Cancellation List, SCL, polar decoder, wherein:
   the plurality of coded bits is a plurality of polar encoded bits that result from a polar encoding of the plurality of interleaved bits comprising the plurality of data bits and the plurality of parity bits that are interleaved with the plurality of data bits in accordance with the interleaving mapping; and
   the modified SCL polar decoder is a SCL polar decoder that takes into account the interleaving mapping.

21. The radio node of claim 19 wherein the plurality of interleaved bits is a sequence of bits comprising the plurality of parity bits interleaved with the plurality of data bits, and the interleaving mapping is such that at least one of the plurality of parity bits precedes at least one of the plurality of data bits in the sequence of bits.

22. The radio node of claim 19 wherein:
   the plurality of interleaved bits is a sequence of bits comprising the plurality of parity bits interleaved with the plurality of data bits;
   each parity bit of the plurality of parity bits is the function of the respective subset of the plurality of data bits; and
   the interleaving mapping is such that at least one of the plurality of parity bits is at a position in the sequence of bits that is: (a) after all of the subset of the plurality of data bits of which the at least one of the plurality of parity bits is the function and (b) before a last of the plurality of data bits within the sequence of bits.

23. The radio node of claim 19 wherein:
   the plurality of interleaved bits is a sequence of bits comprising the plurality of parity bits interleaved with the plurality of data bits;
   each parity bit of the plurality of parity bits is the function of the respective subset of the plurality of data bits; and
   the interleaving mapping is such that at least one of the plurality of parity bits is at a position in the sequence of bits that is: (a) immediately after a last of the subset of the plurality of data bits of which the at least one of the plurality of parity bits is the function within the sequence of bits and (b) before a last of the plurality of data bits within the sequence of bits.

24. The radio node of claim 19 wherein the plurality of data bits and the plurality of parity bits are a result of Cyclic Redundancy Check, CRC, encoding of the plurality of data bits.

* * * * *

UNITED STATES PATENT AND TRADEMARK OFFICE
CERTIFICATE OF CORRECTION

PATENT NO. : 10,498,490 B2
APPLICATION NO. : 16/261731
DATED : December 3, 2019
INVENTOR(S) : Hui et al.

Page 1 of 1

It is certified that error appears in the above-identified patent and that said Letters Patent is hereby corrected as shown below:

In the Claims

In Column 16, Line 54, in Claim 1, delete "$\phi_c$," and insert -- $\phi_c$ --, therefor.

In Column 18, Line 67, in Claim 13, delete "$G_{outer} \triangleq \Phi_r G_{outer} \Phi_c^T$" and insert -- $G'_{outer} \triangleq \Phi_r G_{outer} \Phi_c^T$, --, therefor.

Signed and Sealed this
Nineteenth Day of May, 2020

Andrei Iancu
*Director of the United States Patent and Trademark Office*